(12) United States Patent
Kubota et al.

(10) Patent No.: US 8,596,848 B2
(45) Date of Patent: Dec. 3, 2013

(54) LIQUID CRYSTAL DISPLAY DEVICE, BACKLIGHT AND LED

(75) Inventors: Hidenao Kubota, Yokohama (JP); Satoshi Ouchi, Kamakura (JP); Hiroshi Iwasa, Hayama (JP); Mayumi Nagayoshi, Chofu (JP); Hajime Inoue, Yokohama (JP)

(73) Assignee: Hitachi Consumer Electronics Co., Ltd., Tokyo (JP)

(*) Notice: Subject to any disclaimer, the term of this patent is extended or adjusted under 35 U.S.C. 154(b) by 239 days.

(21) Appl. No.: 13/091,105

(22) Filed: Apr. 20, 2011

(65) Prior Publication Data

US 2011/0316766 A1    Dec. 29, 2011

(30) Foreign Application Priority Data

Jun. 28, 2010 (JP) ................. 2010-145912
Feb. 14, 2011 (JP) ................. 2011-028090

(51) Int. Cl.
*F21V 7/04* (2006.01)

(52) U.S. Cl.
USPC ............ 362/606; 362/612; 362/613; 362/616

(58) Field of Classification Search
USPC .................... 362/606, 612, 613, 97.3
See application file for complete search history.

(56) References Cited

U.S. PATENT DOCUMENTS

| | | | |
|---|---|---|---|
| 6,241,358 B1 | 6/2001 | Higuchi et al. | |
| 8,092,064 B2* | 1/2012 | Erchak et al. | 362/613 |
| 8,243,231 B2* | 8/2012 | Hur et al. | 349/65 |
| 8,350,986 B2* | 1/2013 | Ouchi et al. | 349/62 |
| 2005/0128374 A1 | 6/2005 | Furukawa | |
| 2008/0038853 A1 | 2/2008 | Park et al. | |
| 2008/0191327 A1 | 8/2008 | Asakawa et al. | |
| 2009/0230420 A1* | 9/2009 | Bogner et al. | 257/99 |
| 2010/0045898 A1 | 2/2010 | Lee et al. | |
| 2010/0127294 A1 | 5/2010 | Chen et al. | |
| 2011/0157517 A1 | 6/2011 | Mouri | |
| 2011/0170019 A1 | 7/2011 | Shimizu | |
| 2011/0292684 A1* | 12/2011 | Ajichi | 362/616 |

FOREIGN PATENT DOCUMENTS

| | | |
|---|---|---|
| JP | 11-288611 A | 10/1999 |
| JP | 2001-093321 A | 4/2001 |
| JP | 2003-234507 A | 8/2003 |
| JP | 2004-265635 A | 9/2004 |
| JP | 2005-317820 A | 11/2005 |

(Continued)

OTHER PUBLICATIONS

European Extended Search Report issued Oct. 19, 2011 in European Application No. 11003333.9.

*Primary Examiner* — Evan Dzierzynski
(74) *Attorney, Agent, or Firm* — Miles & Stockbridge P.C.

(57) ABSTRACT

A cross section of each divided light guiding plate is formed in a wedge shape, a step is formed at a portion of each divided light guiding plate where LEDs are arranged, and holes used for accommodating the LEDs are formed at the step. A plated face is formed on a lower face of each LED, and is coupled to a wiring substrate through solder. Each LED includes a light-emitting face, a lower frame, and an upper frame. The height of the lower frame of each LED is larger than the height of the upper frame, so that a lower end of the light-emitting face of each LED can be always located higher than a lower end of the divided light guiding plate.

11 Claims, 9 Drawing Sheets

(56) References Cited

FOREIGN PATENT DOCUMENTS

| | | |
|---|---|---|
| JP | 2008-198807 A | 8/2008 |
| JP | 2010-130008 A | 6/2010 |
| KR | 10-2007-0098193 | 10/2007 |
| KR | 10-2009-0073452 | 7/2009 |
| KR | 10-2009-0102952 | 10/2009 |
| WO | WO2010/098173 * | 2/2010 |
| WO | WO 2010/038583 A1 | 4/2010 |
| WO | WO 2010/041498 A1 | 4/2010 |
| WO | WO-2010/041498 A1 | 4/2010 |

* cited by examiner

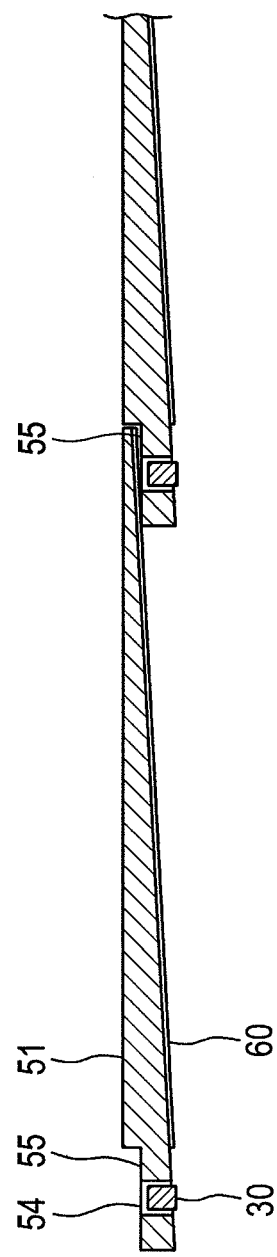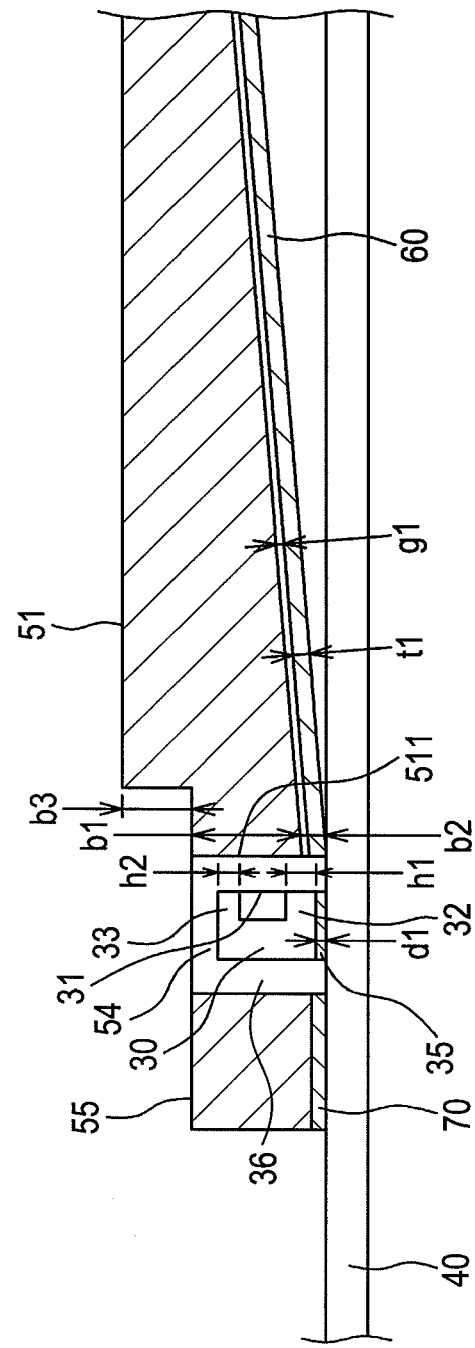

LIQUID CRYSTAL DISPLAY DEVICE, BACKLIGHT AND LED

CLAIM OF PRIORITY

The present application claims priority from Japanese Patent Application JP 2010-145912 filed on Jun. 28, 2010 and Japanese Patent Application JP 2011-028090 filed on Feb. 14, 2011, the content of which is hereby incorporated by reference into this application.

BACKGROUND OF THE INVENTION (1) Field of the Invention

The present invention relates to a liquid crystal display device using Light Emitting Diodes (LEDs) as backlights, and particularly to a thin and relatively-large liquid crystal display device in which uneven brightness is eliminated and which is used for a TV or the like.

(2) Description of the Related Art

Liquid crystal display devices are being used in various fields because they can be made thinner and lighter. Liquid crystal itself does not emit light, and thus backlights are arranged on the back face of a liquid crystal display panel. Fluorescent lamps had been used as backlights for liquid crystal display devices with relatively-large screens such as TVs. However, LEDs are beginning to be used due to demands of thinner liquid crystal display devices and wider color display areas.

Light sources of backlights are arranged in a direct type method in which the light sources are arranged immediately below a liquid crystal display panel, and in a side-light type method in which the light sources are arranged on the side of a light guiding plate. The direct-type light sources have been used in many cases in a liquid crystal display device with a relatively-large screen in order to improve brightness of the screen. However, it is difficult to reduce the thicknesses of the backlights in the direct type. On the other hand, if the screen becomes large in size, the brightness cannot be sufficiently improved, or the backlights cannot be made thinner because the light guiding plate itself becomes thicker in the conventional side-light type method.

Accordingly, there has been developed a configuration in which a light guiding plate of a backlight device is divided into a plurality of blocks, and LEDs are arranged in each block. Japanese Patent Application Laid-Open No. Hei 11-288611 describes a configuration in which light guiding plate blocks divided as planar light source devices each having a large light-emitting area are tandemly arranged. Japanese Patent Application Laid-Open No. Hei 11-288611 describes that in consideration of a difference between both ends and a middle portion of each fluorescent lamp as a primary light source arranged in each light guiding plate block, a tongue-surface superposition portion having notches is formed at a superposition portion between the light guiding plates which are adjacent to each other in order to prevent generation of insufficient brightness of electrode portions on the both ends of the primary light source.

Further, Japanese Patent Application Laid-Open No. 2004-265635 describes a configuration in which an acrylic plate is arranged between a light guiding plate and a diffusion plate in order to prevent generation of uneven brightness at connecting portions between light guiding plate blocks which are tandemly arranged. Further, Japanese Patent Application Laid-Open No. 2004-265635 describes a configuration in which a predetermined distance is set between the light guiding plate and the diffusion plate if the acrylic plate is not used.

On the other hand, it is necessary to arrange LEDs in each block of the divided light guiding plate. LEDs are classified into a general top-view type LED which emits light from the upper side of a package and a side-view type LED which emits light from the side of a package. The side-view type LED is beginning to be used for a liquid crystal display device.

Japanese Patent Application Laid-Open No. 2005-317820 describes a configuration in which LED chips in a package are coupled to each other not through wire bonding but through a conductive adhesive in the side-view type LED, so that the size of the LED package is reduced. Japanese Patent Application Laid-Open No. 2008-198807 describes a configuration in which a lead frame is used for coupling an LED package to a wiring substrate in the side-view type LED, and the area of the lead frame is increased by branching the lead frame to improve heat radiation efficiency from an LED.

Japanese Patent Application Laid-Open No. 2003-234507 describes a configuration in which when the side-view type LED is mounted using solder, a plurality of portions are coupled by soldering in order to prevent displacement and inclination due to contraction of solder.

SUMMARY OF THE INVENTION

In the case where a side-view type LED 30 is used using divided light guiding plates, uneven brightness is generated depending on a positional relation between the LED 30 and a light-incident face of the divided light guiding plate. FIG. 10 is a frame view in which the LED 30 is arranged at an end of a wedge-shape divided light guiding plate 51. The position of the LED 30 relative to a light-incident face 511 of the divided light guiding plate 51 is rotated not only in the x-axis direction, the y-axis direction, or the z-axis direction as shown in FIG. 10A, but also in the α direction, the β direction, and the γ direction as shown in FIG. 10B.

Among such six variable elements of the LED 30 relative to the divided light guiding plate 51, the movement of the LED 30 in the x-axis direction has no major impact on brightness in the normal range of accuracy of assembly. Further, rotation of the LED 30 relative to the light-incident face 511 of the divided light guiding plate 51 in the α direction, the β direction, or the γ direction has no major impact on brightness as long as the rotation angle is 4 degrees or smaller.

On the other hand, the movement of the LED 30 in the z-axis direction in FIG. 10A has a major impact on brightness. FIG. 11 is a diagram for showing a relation between a distance between a light-emitting face of the LED 30 and the light-incident face 511 of the divided light guiding plate 51 and brightness. As shown in FIG. 11, if the light-emitting face of the LED 30 is apart from the light-incident face 511 of the divided light guiding plate 51 by 0.3 mm, the brightness is reduced to about 90%.

Further, the brightness is largely affected when the LED 30 is moved in the minus direction of the y-axis in FIG. 10A, in other words, when the divided light guiding plate 51 is moved upward relative to the LED 30. In FIG. 12, the horizontal axis represents downward movement of the LED 30 relative to the divided light guiding plate 51, in other words, subsidence of the lower end of the light-emitting face of the LED 30 relative to the lower end of the light guiding plate, and the vertical axis represents brightness. As shown in FIG. 12, if the LED 30 is moved downward by about 0.2 mm in FIG. 10A, the brightness is reduced to 90%.

As described above, it is necessary to pay attention to movement of the LED 30 in the z-axis direction and the y-axis direction in terms of the relative position between the LED 30 and the divided light guiding plate 51. Specifically, in order to prevent reduction in brightness, it is necessary to pay attention to avoiding downward movement of the LED 30 relative to the divided light guiding plate 51 so that the LED 30 does not separate from the light-incident face 511 of the divided light guiding plate 51.

Further, variations of the position of the LED 30 relative to the light-incident face 511 of the divided light guiding plate 51 affect uneven brightness of the screen. The uneven brightness of the screen is largely affected by the movement in the y direction of FIG. 10A. FIG. 13 shows uneven brightness in the case where the LED 30 is moved downward relative to the divided light guiding plate 51. FIG. 13 is a diagram in the case where a white color is displayed, and contrast is inverted. Specifically, portions with dark tones are bright positions. In FIG. 13, portions with light tones, namely, portions with low brightness are generated on the left side of the screen.

In the case where the divided light guiding plate 51 is used, uneven brightness is likely to be generated around the screen. The uneven brightness is reduced in the vicinity of the middle of the screen due to leakage of light from the surrounding divided light guiding plates. However, influences from the surrounding divided light guiding plate 51 are limited around the screen. In addition, there is a problem of an insufficient degree of freedom of assembly of the divided light guiding plate 51 due to restriction of an LED package. The present invention realizes a liquid crystal display device or a backlight with less uneven brightness even if the LED 30 is moved in the y-axis direction of the divided light guiding plate 51 when the divided light guiding plate 51 is used.

The present invention overcomes the above-described problems, and a concrete configuration of a liquid crystal display device is described as follows.

Specifically, the present invention provides a liquid crystal display device including: a liquid crystal display panel; a light guiding plate; a side-view type LED; and a wiring substrate on which the light guiding plate and the side-view type LED are mounted, wherein the light guiding plate is formed of a plurality of divided light guiding plates, an upper face of each divided light guiding plate is flat, a back face of each divided light guiding plate is inclined relative to the upper face, a first portion of each divided light guiding plate where the side-view type LED is arranged is thick, and a second portion opposite to the first portion is formed in a wedge shape, a reflection sheet is arranged on a back face of the divided light guiding plates, and the reflection sheet is supported by being sandwiched between the divided light guiding plates and the wiring substrate, a step is formed at each first portion, holes are formed at each step, and the side-view type LED is inserted into each hole, a plated face is formed on a lower face of the side-view type LED, and the side-view type LED is coupled by soldering to the wiring substrate through the plated face, the side-view type LED includes a light-emitting face, a lower frame, and an upper frame, and the height of the lower frame is formed larger than the height of the upper frame, and a lower end of the light-emitting face of the side-view type LED is located higher than a lower end of the light guiding plate.

The above-described configuration can be achieved as an independent backlight except for a liquid crystal display panel.

According to the present invention, it is possible to suppress generation of uneven brightness in a liquid crystal display device having a backlight using a side-view type LED and a divided light guiding plate. Further, according to the present invention, it is possible to suppress generation of uneven brightness in a liquid crystal display device without extremely improving the accuracy of assembly of a side-view type LED and a divided light guiding plate. Moreover, it is possible to suppress generation of uneven brightness in a liquid crystal display device even if the tolerance of the dimension of a side-view type LED is the same as before.

BRIEF DESCRIPTION OF THE DRAWINGS

FIG. 5 is a cross-sectional view in which a light guiding plate is combined with an LED;

FIG. 6 is a detailed cross-sectional view in which the light guiding plate is combined with the LED;

DETAILED DESCRIPTION OF THE EMBODIMENT

Hereinafter, the content of the present invention will be described in detail using an embodiment.

First Embodiment

Figure 1:
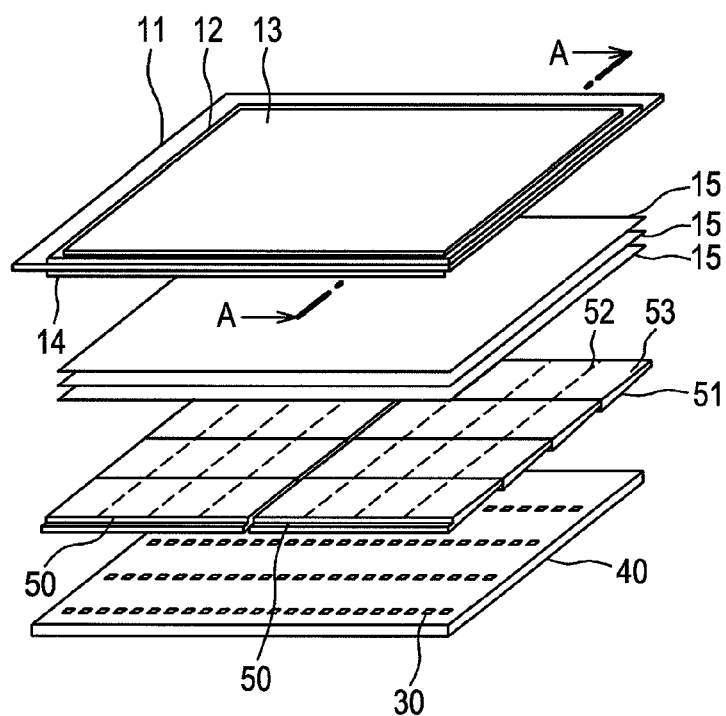
FIG. 1 is an exploded perspective view of a liquid crystal display device to which the present invention is applied.

FIG. 1 is an exploded perspective view of a liquid crystal display device according to the present invention. In FIG. 1, a TFT substrate 11 on which a display area where TFTs and pixel electrodes are arranged in a matrix shape, scanning lines, video signal lines and the like are formed and an opposed substrate 12 on which color filters and the like are formed adhere to each other through an adhesive (not shown). Liquid crystal (not shown) is sandwiched between the TFT substrate 11 and the opposed substrate 12. The TFT substrate 11 is formed larger than the opposed substrate 12 because terminals and the like are formed at the TFT substrate 11.

A lower polarization plate 14 is attached on the lower side of the TFT substrate 11, and an upper polarization plate 13 is attached on the upper side of the opposed substrate 12. The TFT substrate 11, the opposed substrate 12, the lower polarization plate 14, and the upper polarization plate 13 adhere to each other to be called as a liquid crystal display panel. Backlights are arranged on the back face of the liquid crystal display panel. The backlights are formed of light source units and various optical components.

In FIG. 1, LEDs 30 are arranged on a wiring substrate 40 as light source units. The LEDs 30 are arranged while being associated with light guiding plate blocks 53. In FIG. 1, two light guiding plates are arranged in parallel through a predetermined interval. For a large screen, it is more advantageous in manufacturing costs to divide the light guiding plate in plural rather than manufacturing one large light guiding plate. In the case where two light guiding plates 50 are used, a predetermined interval is provided between two light guiding plates to absorb thermal expansion of each light guiding plate 50.

Figure 2:
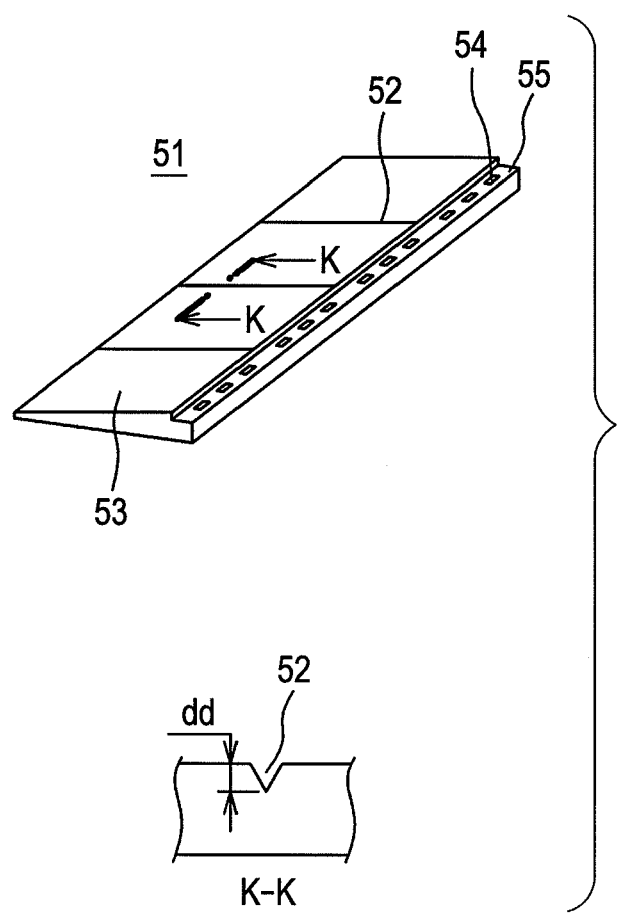
FIG. 2 is a perspective view of a divided light guiding plate.

In FIG. 1, each light guiding plate 50 is formed of four divided light guiding plates 51. FIG. 2 is a perspective view of the divided light guiding plate 51. The divided light guiding plate 51 is divided into four light guiding plate blocks 53 through grooves 52. The grooves 52 allow each light guiding plate block 53 to function as an independent light guiding plate. The shape of each groove is exemplified as a cross-sectional view taken along the line K-K, the cross section is formed in a substantially V-shape, and a depth dd is about 0.5 mm.

In FIG. 2, the divided light guiding plate 51 is formed in a wedge shape. A step 55 is formed at a thicker portion of a light-incident face, and a thinner portion of another divided light guiding plate overlaps with the step 55. LED holes 54 are formed at the step of the divided light guiding plate 51. The LEDs arranged on the wiring substrate are inserted into the LED holes 54.

Figure 3:
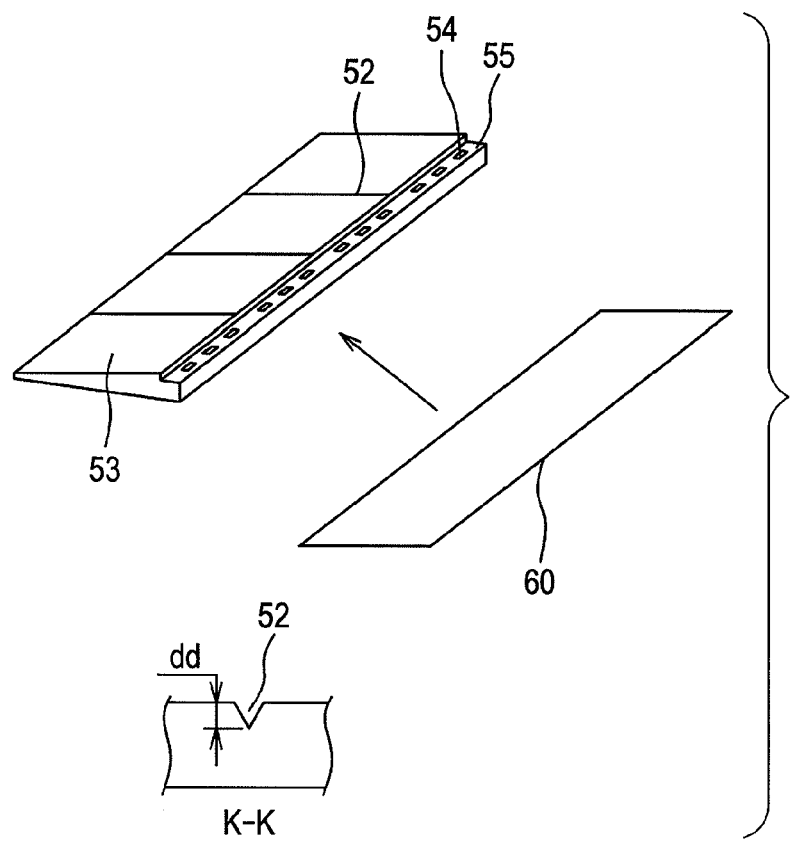
FIG. 3 is a diagram in which a reflection sheet is combined with the divided light guiding plate.

As shown in FIG. 3, a reflection sheet 60 is arranged on the back side of the divided light guiding plate 51. In the embodiment, the reflection sheet 60 is sandwiched between the wiring substrate and the divided light guiding plate, or between the divided light guiding plates.

Referring back to FIG. 1, four rectangular divided light guiding plates 51 are combined to form one light guiding plate 50. In addition, two light guiding plates 50 are arranged in parallel through a predetermined interval. Three diffusion sheets 15 are arranged above the light guiding plates 50. Each diffusion sheet 15 has a thickness as small as about 60 μm, and thus three diffusion sheets 15 are actually placed on the light guiding plates 50. Fine concavities and convexities are formed on the surface of each diffusion sheet 15, and allow light from the light guiding plates 50 to diffuse. Further, the fine concavities and convexities on the surface serve as a kind of prism to direct light that obliquely enters the diffusion sheet 15 to the direction of the liquid crystal display panel.

Three as the number of diffusion sheets 15 is an example, and the number of diffusion sheets 15 may be one, two or larger than three as needed. Further, in addition to the diffusion sheets 15, prism sheets may be arranged if needed. The prism sheets function to direct light that obliquely enters from the backlights to the direction of the liquid crystal display panel, so that the brightness of the screen is improved. It should be noted that the diffusion sheets 15 are directly placed on the light guiding plates 50 in the example of FIG. 1. However, a diffusion plate may be arranged on the light guiding plates 50, and the diffusion sheets 15 may be placed on the diffusion plate.

In FIG. 1, the liquid crystal display panel is arranged on the uppermost layer of the diffusion sheets 15. However, in order to prevent scratches caused by friction between the diffusion sheet 15 and the lower polarization plate 14, an interval of about 50 μm is provided between the liquid crystal display panel and the diffusion sheet even after assembly.

Figure 4:
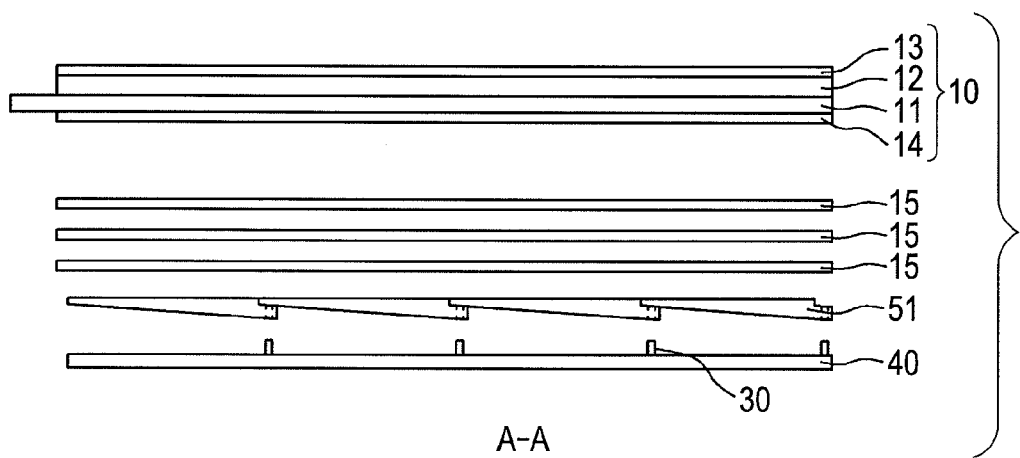
FIG. 4 is an exploded cross-sectional view of the liquid crystal display device to which the present invention is applied.

FIG. 4 is an exploded cross-sectional view of the liquid crystal display device taken along the line A-A in FIG. 1. In FIG. 4, the liquid crystal display panel 10 and three diffusion sheets 15 are the same as explained in FIG. 1. In FIG. 4, the divided light guiding plates 50 are arranged under the lowermost diffusion sheet 15. Each light guiding plate 50 is formed of four divided light guiding plates 51. As explained in FIG. 1, each divided light guiding plate 51 includes four light guiding plate blocks 53.

The cross section of each divided light guiding plate 51 is formed in a wedge shape. Each divided light guiding plate 51 has a thick portion and a thin portion. Each thick portion has a thickness of about 3 mm, and each thin portion has a thickness of nearly 1 mm. The thin portion of the divided light guiding plate 51 enters the step formed at the thick portion of the divided light guiding plate 51 that is located ahead, and thus the divided light guiding plates 51 can be viewed as one light guiding plate.

The LED holes 54 are formed at the step 55 of each divided light guiding plate 51, and the LEDs 30 arranged on the wiring substrate 40 are inserted into the LED holes 54. The LEDs 30 are side-view type LEDs. Light from the LEDs 30 inserted into the LED holes 54 of the divided light guiding plate 51 is changed to a planar shape through the light guiding plate 50, and is emitted after the direction of the light is changed to the liquid crystal display panel 10 in the light guiding plate 50.

FIG. 5 is a cross-sectional view for showing a relation between the divided light guiding plate 51 and the side-view type LED 30. In FIG. 5, the LED 30 is inserted into the LED hole 54 formed at the step 55 of the divided light guiding plate 51. The LED 30 is arranged on the wiring substrate (not shown). The reflection sheet 60 is arranged under the divided light guiding plate 51. The reflection sheet 60 is sandwiched between the step 55 of another divided light guiding plate 51 and the wiring substrate (not shown).

FIG. 6 is a detailed diagram for showing a relation between the divided light guiding plate 51 and the LED 30. In FIG. 6, the LED 30 is inserted into the LED hole 54 formed at the step 55 of the divided light guiding plate 51. The LED 30 is arranged on the wiring substrate 40. The divided light guiding plate 51 adheres to the wiring substrate 40 through a double-sided adhesive tape 70.

The reflection sheet 60 is arranged on the lower face of the divided light guiding plate 51. The reflection sheet 60 does not adhere to the divided light guiding plate 51, but is sandwiched between the wiring substrate 40 and the step of another light guiding plate (not shown). Thus, a gap g1 is present between the reflection sheet 60 and the divided light guiding plate 51. The gap g1 has a size of about 0.1 mm. The thickness t1 of the reflection sheet 60 is 0.19 mm, and thus an interval b2 having a size of about 0.29 mm is present between the lower face of the divided light guiding plate 51 and the wiring substrate 40. The height b1 of a light-incident face 511 of the divided light guiding plate 51 is 1.8 mm, and the depth b3 of the step is about 1 mm.

In FIG. 6, a plated face serving as an electrode portion formed on the lower face of the LED 30 inserted into the LED hole 54 is coupled to the wiring substrate 40 through solder 35. The thickness d1 of the solder 35 is about 0.05 mm. It should be noted that the wiring substrate 40 is covered with a resist as an insulator except for connection portions with the LED 30 and the like, and the dimensions shown in FIG. 6 are based on the surface of the resist on the wiring substrate.

An upper frame 33 and a lower frame 32 are present on the upper side and the lower side of a light-emitting face 31 of LED 30 that emits light, respectively. The embodiment is characterized in that the lower frame 32 of the LED 30 is always larger in size than the upper frame 33 of the LED. Specifically, the circumference of the light-emitting face 31 of the LED 30 according to the embodiment is surrounded by or covered with a frame member 36 configuring an LED package, and the frame member 36 includes the upper frame 33 and the lower frame 32. In addition, the dimension (the dimension in the direction orthogonal to the lower face of the LED 30) of the lower frame 32 in the height direction is larger than the height of the upper frame 33. The frame member 36 configuring the LED package is made of, for example, resin or ceramic. Further, it is assumed that when the LED 30 is viewed from the side of the light-emitting face 31, the lower frame 32 is a frame member located between the plated face as an electrode portion formed on the lower face of the LED 30 and the lower end of the light-emitting face 31, and the upper frame 33 is a frame member located above (direction opposed to the plated face) the upper end of the light-emitting face 31.

Figure 9:
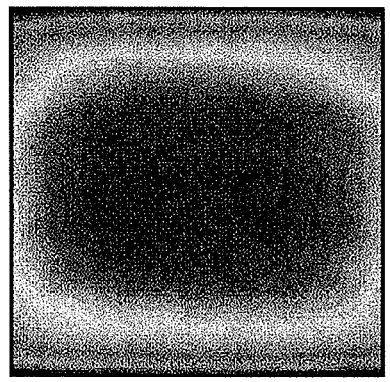
FIG. 9 is an example of uneven brightness in the case of using the present invention.
Figure 10A:
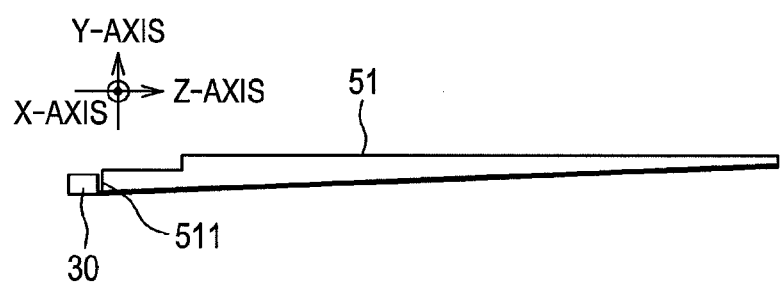
FIGS. 10A and 10B are diagrams each showing a positional relation between the light guiding plate and the LED.
Figure 10B:
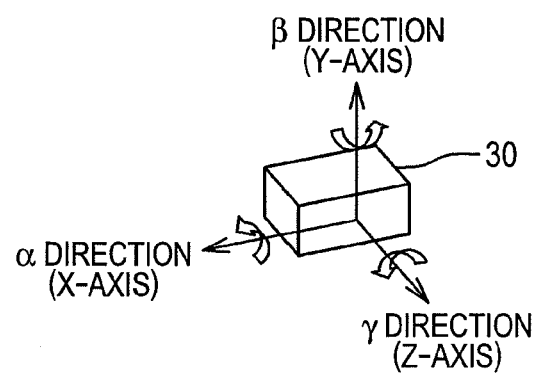
Figure 11:
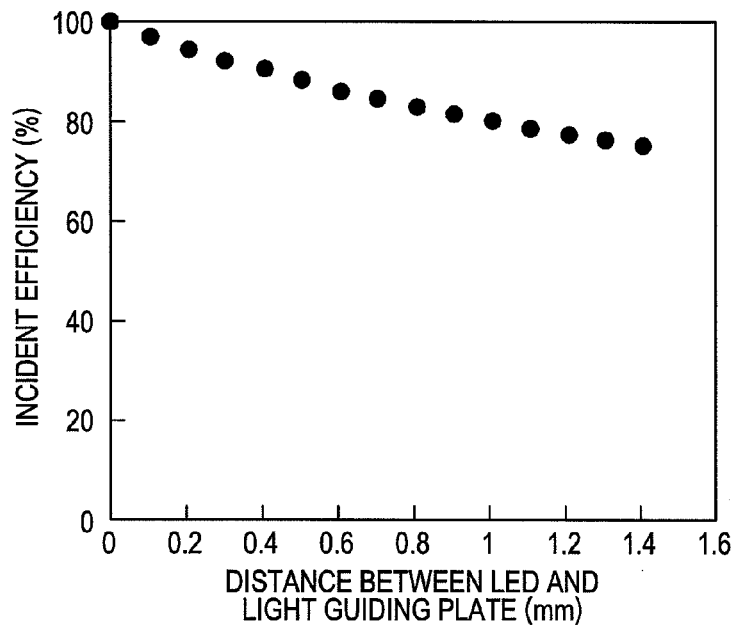
FIG. 11 is a graph for showing a relation between a distance between the light guiding plate and the LED and brightness.
Figure 12:
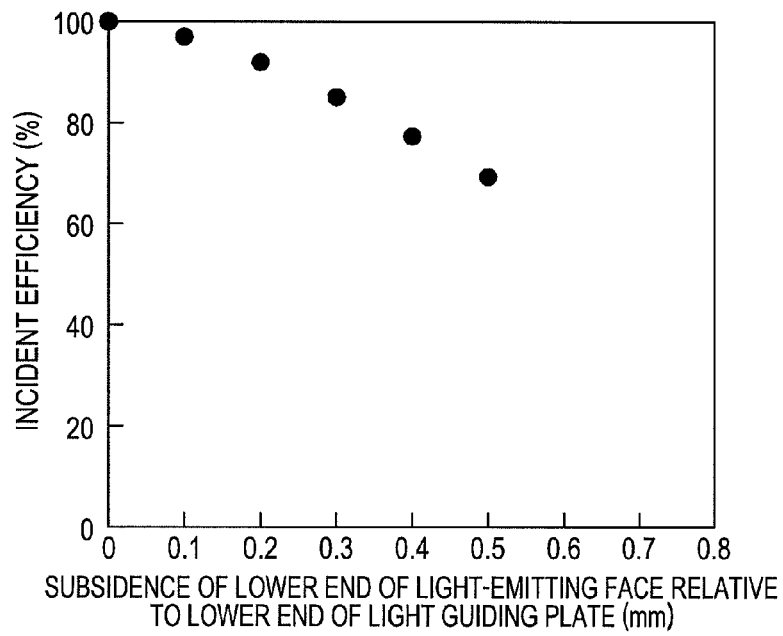
FIG. 12 is a graph for showing a relation between a positional relation in the vertical direction between the light guiding plate and the LED and brightness.
Figure 13:
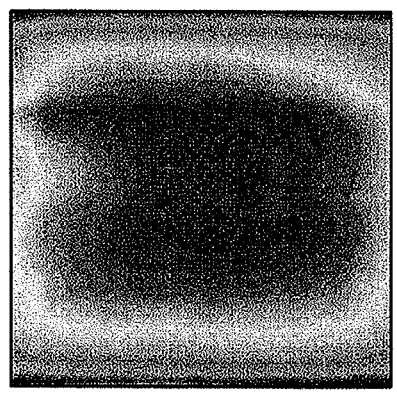
FIG. 13 is a conventional example of uneven brightness.

Accordingly, the light-emitting face 31 of the LED 30 can always and stably face the light-incident face 511 of the divided light guiding plate 51. Specifically, if the lower end of the light-emitting face 31 of the LED 30 is located lower than the lower end of the light-incident face 511 of the divided light guiding plate 51, uneven brightness is generated as shown in FIG. 13. In the embodiment, since the light-emitting face 31 of the LED 30 is always located higher than the lower end of the light-incident face 511 of the divided light guiding plate 51, uneven brightness, especially, uneven color on the left side of the screen as shown in FIG. 13 is not generated. FIG. 9 shows distribution of brightness according to the embodiment. In FIG. 9, portions with dark tones are high in brightness as similar to FIG. 13. It can be found by comparison of distribution of brightness between FIG. 9 and FIG. 13 that the configuration of the present invention eliminates the uneven brightness, especially, uneven color on the left side of the screen as shown in FIG. 13.

Figure 7A:
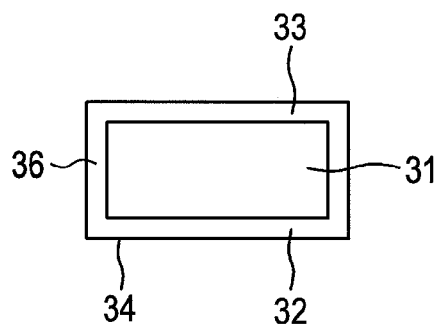
FIGS. 7A and 7B are diagrams each showing a shape of a conventional LED.
Figure 7B:
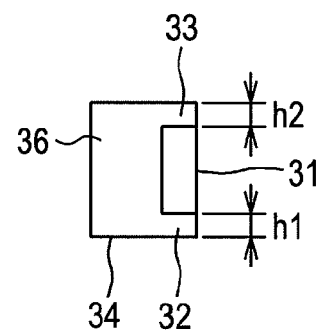

FIGS. 7A and 7B are diagrams each showing a shape of a conventional side-view type LED. FIG. 7A is a front view thereof and FIG. 7B is a side view thereof. In FIGS. 7A and 7B, a plated face 34 as an electrode portion is formed on the lower face of the LED 30, and can be coupled to the wiring substrate 40 by soldering. In FIGS. 7A and 7B, the circumference of the light-emitting face 31 of the LED 30 is surrounded by the frame member 36. The upper frame 33 and the lower frame 32 are formed with the same dimension. If the upper frame 33 and the lower frame 32 are formed with the same dimension, the yield rate of the material of the LED package is improved, and products can be easily managed.

Figure 8A:
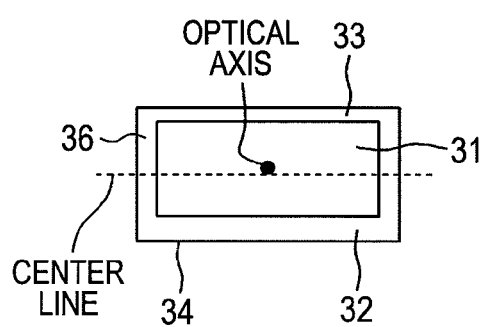
FIGS. 8A and 8B are diagrams each showing a shape of an LED used in the present invention.
Figure 8B:
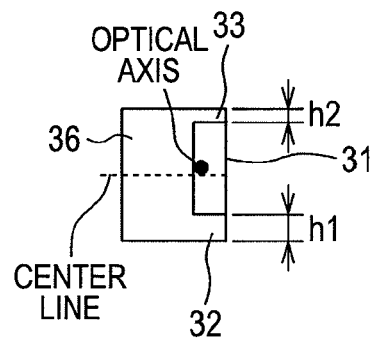

On the contrary, in the embodiment, the upper frame 33 and the lower frame 32 of the frame member 36 that surrounds the circumference of the light-emitting face 31 of the LED 30 and is made of resin or ceramic are intentionally made unbalanced. FIGS. 8A and 8B are diagrams each showing a shape of the side-view type LED 30 used in the present invention. FIG. 8A is a front view thereof and FIG. 8B is a side view thereof. In FIGS. 8A and 8B, the plated face 34 as an electrode portion is formed on the lower face of the LED 30, and can be coupled to the wiring substrate 40 by soldering. In FIGS. 8A and 8B, the dimension h1 of the lower frame is always larger than the dimension h2 of the upper frame. Specifically, in the LED 30 according to the embodiment, the light-emitting face is configured in such a manner that the optical axis located in the middle of the light-emitting face of the LED 30 is located above the center line (illustrated by the dashed line in each of FIGS. 8A and 8B) that halves the height (the dimension in the direction orthogonal to the lower face coupled to the wiring substrate 40) of the LED 30, namely, the optical axis is located in the direction opposed to the lower face. In other words, the optical axis of the LED 30 is shifted or deviated upward from the center line.

In FIGS. 8A and 8B, the height h1 of the lower frame 32 is, for example, 0.3 mm, and the height h2 of the upper frame 33 is, for example, 0.2 mm. The dimension of the package varies depending on productions. However, the height h1 of the lower frame 32 is always larger than the height h2 of the upper frame 33 even if the variations of productions are considered. It should be noted that the height of the lower frame 32 corresponds to that from the lower face of the plated face 34. In addition, the dimension of the height h1 of the lower frame 32 is set at 0.3 mm or larger, so that the lower end of the light-emitting face 31 of the LED 30 can be always arranged higher than the lower end of the light-incident face 511 of the divided light guiding plate 51. The height h1 of the lower frame 32 is set at 0.3 mm, but may be set at 0.5 to 0.7 mm. Specifically, the height h1 of the lower frame 32 may be in the range of 0.3 to 0.7 mm. However, the height h1 of the lower frame 32 is not limited to the range, but may be set so as to satisfy any one of the following conditions 1 and 2, as being apparent from the configuration illustrated in FIG. 6.

$$h1+d1 \geq b2 \text{ (or } g1+t1\text{)} \qquad \text{(condition 1)}$$

$$b1 \geq h1 \geq b2 \text{ (or } g1+t1\text{)} \qquad \text{(condition 2)}$$

Specifically, the height h1 of the lower frame 32 according to the embodiment is, at least, the dimension or larger obtained by subtracting the thickness d1 of the solder 35 from the sum of the gap g1 between the reflection sheet 60 and the divided light guiding plate 51 and the thickness t1 of the reflection sheet 60, and is, at least, the height b1 or smaller of the light-incident face 511 of the divided light guiding plate 51. With this configuration, light from the LED 30 can be preferably allowed to enter the light-incident face 511 of the divided light guiding plate 51.

There are various methods to arrange the lower end of the light-emitting face 31 of the LED higher than the lower end of the light-incident face 511 of the divided light guiding plate 51. For example, the thickness of the double-sided adhesive tape 70 that allows the divided light guiding plate 51 to adhere to the wiring substrate 40 is reduced. However, if the thickness of the double-sided adhesive tape 70 is reduced, the adhesive force between the divided light guiding plate 51 and the wiring substrate 40 is decreased, causing a problem in reliability.

As another method of arranging the lower end of the light-emitting face 31 of the LED higher than the lower end of the light-incident face 511 of the divided light guiding plate 51, the thickness d1 of the solder 35 coupling the LED 30 to the wiring substrate 40 is increased. However, if the thickness d1 of the solder 35 is increased, the position of the LED after soldering is inaccurately set. Specifically, the LED 30 is largely inclined, causing generation of uneven brightness.

Further, if a lead frame is used in order to couple the LED 30 to the wiring substrate 40, it is possible to heighten the position of the light-emitting face 31 of the LED 30 after coupling by the thickness of the lead frame. However, it is necessary to insert an LED with a lead frame into the LED hole formed at the light guiding plate in this case, and to increase the dimension of the LED hole.

On the other hand, if the LED according to the present invention is used, the above-described problem does not occur. According to the present invention as described above, uneven brightness can be reduced without deterioration in reliability and accuracy of arrangement of the LED 30 in the backlight and the liquid crystal display device using the divided light guiding plates 51.

Figure 14:
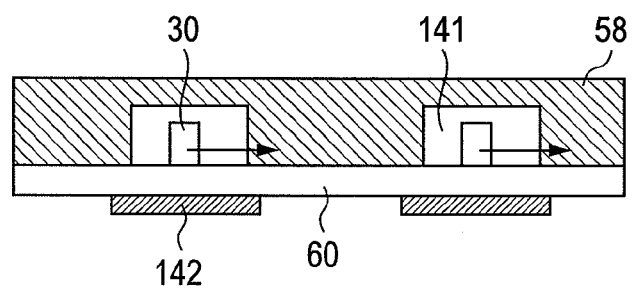
FIG. 14 is a cross-sectional view taken along the line Y-Y' of FIG. 15.
Figure 15:
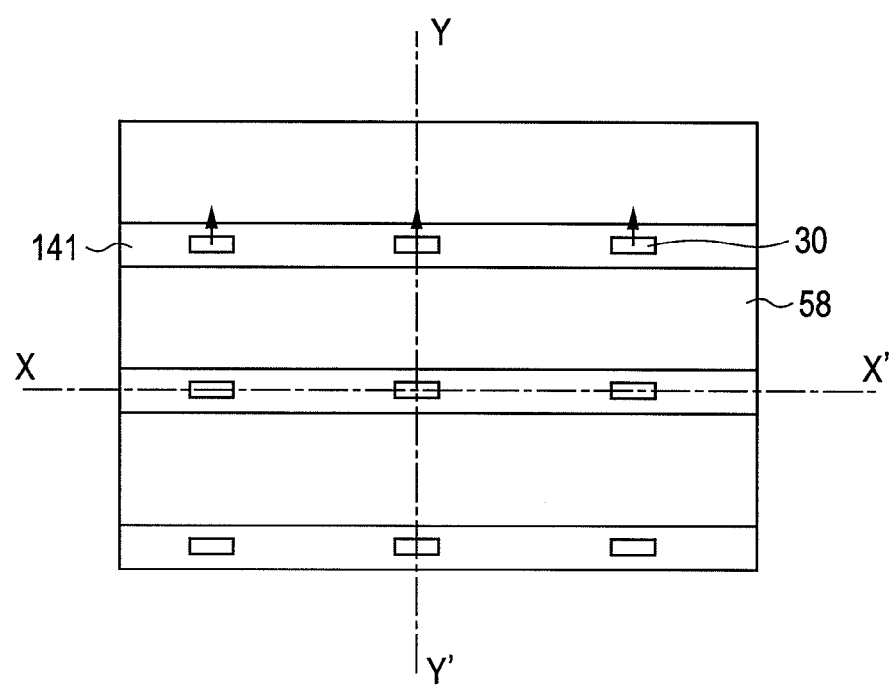
FIG. 15 is a diagram of a light guiding plate viewed from the light-emitting face.

In the above description of the example of the embodiment, the cross section of the light guiding plate is formed in a wedge shape so that the thickness thereof becomes thinner towards the light-emitting direction from the LED. However, a light guiding plate 58 having substantially the same thickness may be used as shown in, for example, FIG. 14 and FIG. 15. FIG. 14 shows a cross section that is orthogonal to the light-emitting face (the face on the upper side of the drawing) and is in parallel with the light-emitting direction (illustrated by the arrow in each of FIG. 14 and FIG. 15) of each LED 30. Specifically, FIG. 14 is a cross-sectional view taken along the line Y-Y' of FIG. 15. FIG. 15 is a diagram of the light guiding plate 58 viewed from the light-emitting face. As shown in the drawings, in the case where the light guiding plate 58 having substantially the same thickness is used, a plurality of holes or grooves 141 are provided on the back-face side of the light guiding plate 58, and a plurality of side-view type LEDs 30 are arranged in the holes or the grooves 141. The side-view type LEDs 30 are those according to the embodiment shown in FIG. 6, FIG. 8, and the like. Holes are provided in the reflection sheet 60 at the positions corresponding to the LEDs 30, and the LEDs 30 are inserted into the holes from the back-face side of the reflection sheet 60 to be exposed to the grooves 141. The LEDs 30 are mounted on a wiring substrate 414, and the reflection sheet 60 is held by being sandwiched between the wiring substrate 414 and the back face of the light guiding plate 58. The wiring substrate 414, the reflection sheet 60, and the light guiding plate 58 may be coupled to each other by inserting, for example, slender pins (not shown) made of resin into them.

As described above, the embodiment can be applied using the light guiding plate having the configuration shown in FIG. 14 and FIG. 15. In this case, the height of each side-view type LED 30 is smaller than that of each hole or groove 141. Further, although not shown in the drawing, darkening members formed of, for example, colored films or the like may be provided on the light-emitting face of the light guiding plate 58 at the positions corresponding to the holes or the grooves 141 to darken light directed upward from the LEDs 30. Accordingly, the brightness of light spots each having the shape corresponding to the LED or the groove 141 which can be viewed from the light-emitting face side can be reduced.

What is claimed is:

1. A side-view type LED used for supplying light to a side face of a light guiding plate of a liquid crystal display device, comprising:
   a plated face which is formed on a lower face of the side-view type LED and can be coupled by soldering to a wiring substrate on which the side-view type LED is mounted;
   a light-emitting face which emits light; and
   a frame member which surrounds the light-emitting face,
   wherein the frame member includes a lower frame located between the plated face and the light-emitting face and an upper frame located higher than the light-emitting face,
   the height of the lower frame is formed to be always larger than the height of the upper frame, and
   the height of the lower frame is 0.3 mm or larger, and the height of the upper frame is approximately 0.2 mm.

2. A side-view type LED used as a light source for a backlight of a liquid crystal display device, comprising:
   an electrode portion formed on a lower face of the side-view type LED;
   a light-emitting face which emits light; and
   a frame member which surrounds the light-emitting face,
   wherein the frame member includes a lower frame located between the electrode portion and the light-emitting face and an upper frame located higher than the light-emitting face,
   the height of the lower frame is larger than the height of the upper frame so that an optical axis of the light-emitting face is located above a center line that halves the height of the side-view type LED, and
   the height of the lower frame is 0.3 mm or larger, and the height of the upper frame is approximately 0.2 mm.

3. The side-view type LED according to claim 2, wherein the frame member is a member configuring the side-view type LED package and is made of resin or ceramic.

4. A backlight for irradiating light onto a liquid crystal panel of a liquid crystal display device, comprising:
   a side-view type LED as a light source;
   a light guiding plate which includes a light-incident face which light from the side-view type LED enters, and emits the incident light in a planar shape;
   a reflection sheet which is arranged on the back-face side of the light guiding plate and which reflects the light emitted from the back face of the light guiding plate to be returned to the light guiding plate; and
   a wiring substrate which is located on the back-face side of the reflection sheet and on which the side-view type LED is mounted,
   the side-view type LED including:
      an electrode portion which is formed on a lower face of the side-view type LED and can be coupled to the wiring substrate by soldering,
      a light-emitting face which emits light, and
      a frame member which surrounds the light-emitting face,
   wherein the frame member includes a lower frame located between a plated face and the light-emitting face and an upper frame located higher than the light-emitting face,
   the height of the lower frame is formed to be always larger than the height of the upper frame,
   the frame member is a member configuring a side-view type LED package and is made of resin or ceramic, and
   b1≥h1≥b2 is satisfied in which h1 represents the dimension of the lower frame, b1 represents the height of the light-incident face of the light guiding plate, and b2 represents a space between the lower face of the light guiding plate and the wiring substrate.

5. The backlight according to claim 4, wherein the dimension of the lower frame is 0.3 mm to 0.7 mm.

6. A backlight for irradiating light onto a liquid crystal panel of a liquid crystal display device, comprising:
   a side-view type LED as a light source;
   a light guiding plate which includes a light-incident face which light from the side-view type LED enters, and emits the incident light in a planar shape;
   a reflection sheet which is arranged on the back-face side of the light guiding plate and which reflects the light emitted from the back face of the light guiding plate to be returned to the light guiding plate; and
   a wiring substrate which is located on the back-face side of the reflection sheet and on which the side-view type LED is mounted,
   the side-view type LED including:
      an electrode portion which is formed on a lower face of the side-view type LED and can be coupled to the wiring substrate by soldering,
      a light-emitting face which emits light, and a frame member which surrounds the light-emitting face, wherein the frame member includes a lower frame located between a plated face and the light-emitting face and an upper frame located higher than the light-emitting face, the height of the lower frame is formed to be always larger than the height of the upper frame, the frame member is a member configuring a side-view type LED package and is made of resin or ceramic, and $b1 \geq h1 \geq g1+t1$ is satisfied in which $h1$ represents the dimension of the lower frame, $b1$ represents the height of the light-incident face of the light guiding plate, $g1$ represents a gap between the reflection sheet and the light guiding plate, and $t1$ represents the thickness of the reflection sheet.

7. The backlight according to claim 6, wherein the dimension of the lower frame is 0.3 mm to 0.7 mm.

8. A backlight for irradiating light onto a liquid crystal panel of a liquid crystal display device, comprising:

a side-view type LED as a light source;

a light guiding plate which includes a light-incident face which light from the side-view type LED enters, and emits the incident light in a planar shape;

a reflection sheet which is arranged on the back-face side of the light guiding plate and which reflects the light emitted from the back face of the light guiding plate to be returned to the light guiding plate; and a wiring substrate which is located on the back-face side of the reflection sheet and on which the side-view type LED is mounted, the side-view type LED including:

an electrode portion which is formed on a lower face of the side-view type LED and can be coupled to the wiring substrate by soldering, a light-emitting face which emits light, and a frame member which surrounds the light-emitting face, wherein the frame member includes a lower frame located between a plated face and the light-emitting face and an upper frame located higher than the light-emitting face, the height of the lower frame is formed to be always larger than the height of the upper frame, the frame member is a member configuring a side-view type LED package and is made of resin or ceramic, and $h1+d1 \geq b2$ is satisfied in which $h1$ represents the dimension of the lower frame, $b1$ represents the height of the light-incident face of the light guiding plate, $d1$ represents the thickness of the solder, and $b2$ represents a space between the lower face of the light guiding plate and the wiring substrate.

9. The backlight according to claim 8, wherein the dimension of the lower frame is 0.3 mm to 0.7 mm.

10. A backlight for irradiating light onto a liquid crystal panel of a liquid crystal display device, comprising:

a side-view type LED as a light source;

a light guiding plate which includes a light-incident face which light from the side-view type LED enters, and emits the incident light in a planar shape;

a reflection sheet which is arranged on the back-face side of the light guiding plate and which reflects the light emitted from the back face of the light guiding plate to be returned to the light guiding plate; and a wiring substrate which is located on the back-face side of the reflection sheet and on which the side-view type LED is mounted, the side-view type LED including:

an electrode portion which is formed on a lower face of the side-view type LED and can be coupled to the wiring substrate by soldering, a light-emitting face which emits light, and a frame member which surrounds the light-emitting face, wherein the frame member includes a lower frame located between a plated face and the light-emitting face and an upper frame located higher than the light-emitting face, the height of the lower frame is formed to be always larger than the height of the upper frame, the frame member is a member configuring a side-view type LED package and is made of resin or ceramic, and $h1+d1 \geq g1+t1$ is satisfied in which $h1$ represents the dimension of the lower frame, $d1$ represents the thickness of the solder, $g1$ represents a gap between the reflection sheet and the light guiding plate, and $t1$ represents the thickness of the reflection sheet.

11. The backlight according to claim 10, wherein the dimension of the lower frame is 0.3 mm to 0.7 mm.

* * * * *